US006479139B1

(12) United States Patent
Claeson et al.

(10) Patent No.: US 6,479,139 B1
(45) Date of Patent: Nov. 12, 2002

(54) SUPERCONDUCTING SUBSTRATE STRUCTURE AND A METHOD OF PRODUCING SUCH STRUCTURE

(75) Inventors: Tord Claeson, Mölndal (SE); Zdravko Ivanov, Göteborg (SE); Erland Wikborg, Danderyd (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 143 days.

(21) Appl. No.: 09/718,668

(22) Filed: Nov. 22, 2000

(30) Foreign Application Priority Data

Nov. 23, 1999 (SE) ................................ 9904263

(51) Int. Cl.⁷ ............................ B32B 7/02; H01L 39/00
(52) U.S. Cl. ..................... 428/216; 505/237; 505/234; 505/434; 505/500
(58) Field of Search ................ 428/216, 702, 428/701, 930; 505/234, 237, 239, 812, 329, 330, 434, 450, 500, 742

(56) References Cited

U.S. PATENT DOCUMENTS

| | | | | |
|---|---|---|---|---|
| 3,803,459 A | * | 4/1974 | Matisoo | 257/32 |
| 5,476,819 A | | 12/1995 | Warren | |
| 5,523,282 A | * | 6/1996 | Simon et al. | 428/688 |
| 5,523,283 A | * | 6/1996 | Simon et al. | 427/62 |
| 5,567,330 A | * | 10/1996 | Dorothy | 216/18 |
| 5,811,375 A | * | 9/1998 | Nakamura et al. | 117/106 |
| 5,906,963 A | * | 5/1999 | Simon et al. | 438/697 |
| 6,117,824 A | * | 9/2000 | Simon et al. | 333/99 S |
| 6,297,200 B1 | * | 10/2001 | Simon et al. | 505/202 |
| 6,324,413 B1 | * | 11/2001 | Simon et al. | 428/930 |
| 6,358,119 B1 | * | 3/2002 | Shih et al. | 451/36 |
| 6,376,268 B1 | * | 4/2002 | Verdiell | 257/433 |

FOREIGN PATENT DOCUMENTS

WO 94/14201 6/1994

OTHER PUBLICATIONS

McDaniel, et al., "Influence of SrTiO3 bicrystal microstructural defects on YBa2Cu3O7 grain–boundary Josephson junctions" Applied Physics Letters 10 (14), Apr. 7, 1997, pp. 1882–1884.*

K.K. Likharev & V.K. Semenov, "RSFQ Logic/Memory Family: A New Josephson Junction Technology for Sub–Terahertz–Clock Frequency Digital Systems", IEEE Transactions On Applied Superconductivity, vol. 1, No. 1, Mar. 1991, pp. 3–28 (IEEE, New York).

A.L. Vasiliev, G. Van Tendeloo, A. Amelinckx, Yu. Boikov, E. Olsson, and Z. Ivanov, "Structural aspect of YBa2Cu3O7_x films on Si with complex barrier layers", Physica C 244 (1995), pp. 373–388 Elsevier, Amsterdam).

* cited by examiner

Primary Examiner—Tom Dunn
Assistant Examiner—Colleen P. Cooke
(74) Attorney, Agent, or Firm—Burns, Doane, Swecker & Mathis, L.L.P.

(57) ABSTRACT

A superconducting substrate structure with a high temperature superconducting (HTS) ground plane, for epitaxial growth of multilayers thereon is provided. The substrate structure includes a composite substrate structure with a first and a second substrate layer each covered by an HTS film, which HTS films are bonded together through annealing to form a buried superconducting layer wherein one of the substrate layers is polished to form a smooth insulating layer adjacent to an HTS layer. A method of producing a superconducting substrate structure is provided including the steps of arranging two substrate layers on which HTS films are provided such that the HTS films come in close contact to one another, applying a high pressure in an oxygen atmosphere and at an elevated temperature such that the HTS films are annealed and bonded together, and subsequently polishing one of the substrate layers to form a smooth insulator.

19 Claims, 3 Drawing Sheets

SUPERCONDUCTING SUBSTRATE STRUCTURE AND A METHOD OF PRODUCING SUCH STRUCTURE

BACKGROUND

The present invention relates to a superconducting substrate structure comprising a high temperature superconducting ground plane for epitaxial growth of multilayers thereon. The insertion also relates to a multilayer structure comprising a number of alternating high temperature superconducting film (HTS) and insulating layers epitaxially grown on a substrate structure. Still further the invention relates to a method of producing a substrate structure with a superconducting ground plane and a method of producing a multilayer structure.

The field of superconducting electronics has become more and more attractive and undergoes a fast development. There is a need for superconducting digital and microwave circuit devices which cart be made as small as possible, very compact and which, in addition thereto, are fast. Superconducting digital and microwave devices require multilayer structures which consist of insulating and superconducting layers stacked on top of one another. For example superconducting microwave circuits require a superconducting ground plane to confine the fields in order to reduce crosstalk between two adjacent lines. In so called Rapid Single Flux Quantum digital circuits (RSFQ) cf. for example "RSFQ Logic/Memory Family: A New Josephson-Junction Technology for Sub-Teraherz Clock Frequency Digital Systems" by K. K. Likharev and V. K. Semenov in IEEE Transaction on Applied Superconductivity, Vol. 1, No. 1. March 1991 which presents a RSFQ circuit family which is based on processing of single flux quanta wherein each digital information bit is represented by a single flux quantum (a fluxon), also needs a superconducting ground plane in order to reduce he circuit inductance to such an extent that it get possible to build complex circuits.

An article by A. L. Vasiliev et al., in Physica C, 244, 373–378 (1995) discloses the making of a superconductor ground plane in HTS circuits by growing an insulating film on top of an HTS-film which is epitaxially grown on an insulator. However, a serious disadvantage of this arrangement is that the top insulating layer will not be smooth enough for multilayers to grow epitaxially thereon. This actually constitutes one of the main obstacles to the development of complex superconducting digital circuits and microwave circuits.

WO 94/14202 shows an electrical interconnect structure which comprises a number of high temperature superconducting signal layer substructures Such a structure may comprise signal layer substructures bonded by dielectric layers bonded to one another and to a base substructure containing power and ground planes. This document among others discusses the problems involved in sequential epitaxial deposition of multilayers, among others that the materials have to be chosen such that the coefficients of thermal expansion of all the materials are substantially the same and that the dielectric materials that are used also have to have the proper-electric constant and low microwave losses. The document among others discloses processes for making structures in which no all layers involve epitaxial deposition thus avoiding the severe constraints. However, the structures illustrated in this document and the method of making such are comparatively complicated and do also not provide an entirely satisfactory structure.

SUMMARY

What is needed is therefore a superconducting substrate structure having a superconducting ground plane through which it is possible to build complex electronic circuits, in particular complex superconducting digital microwave circuits. Particularly a substrate structure is needed through which the growing of multilayers structures thereon, particularly through epitaxial growth, is enabled. Moreover a substrate structure is needed through which an insulating layer is provided which is smooth enough for multilayers to be grown epitaxially on top of it. Particularly a substrate structure is needed which comprises a large area substrate having an optically smooth surface suitable for epitaxial growth on it and which has a buried high temperature superconducting ground plane.

A multilayer structure having a buried HTS film serving as a ground plane is also needed fulfilling the above mentioned objects and which electronic circuits can be etched out of. Particularly a multilayer structure formed by epitaxial growth is needed fulfilling the above mentioned objects.

A method of producing a superconducting substrate structure as well as a multilayer structure is also needed through which the above mentioned objects are fulfilled and which is simple to implement and which moreover does not involve any high costs.

Therefore a superconducting substrate structure comprising a high temperature superconducting ground plane e.g. for epitaxial growth of multilayers thereon is provided which comprises a composite substrate structure comprising a first substrate layer aid a second substrate layer. Each of the substrate layers are covered by a HTS film on at least one side thereof which HTS films are bonded together through annealing to form a buried superconducting layer and of which one of the substrate layers is polished to form a smooth insulator adjacent to an HTS layer In particular the first and the second substrate layers, before bonding of the superconducting films arranged thereon, have a thickness of about 0.1–1 mm. In a particular implementation the high temperature superconducting films covering said first and second substrate layers which subsequently are bonded together forming a HTS layer each have a thickness of about 200 nm. Advantageously the substrate structure comprises a large area substrate structure. In an advantageous implementation a multilayer structure is epitaxially grown on top of the substrate layer which forms a smooth insulator. Particularly the HTS layer is formed in that the high temperature superconducting films are bonded to each other through annealing in oxygen under a high pressure and at a high temperature. Particularly the polished substrate layer forms a smooth insulator having a thickness of about 1–50 $\mu$m. In particularly advantageous embodiment the HTS films comprise YBCO and the substrate layers advantageously comprise $SrTiO_3$, MgO, $LaAlO_3$, Y—ZrOz, other alternatives however also being possible.

Therefore also a multilayer structure is provided which comprises a number of alternating high temperature superconducting layers and insulating layers epitaxially grown on a substrate structure comprising a superconducting ground plane. The substrate structure comprises a composite substrate structure comprising a first substrate layer and a second substrate layer, each covered by a HTS film on at least one side thereof respectively, which HTS films are bonded together through annealing to form a buried. HTS layer. The substrate layer on which the HTS films and insulating layers are grown is polished to form a smooth insulator, thus suitable for epitaxial growth thereon. Particularly the substrate layer which is not polished, i.e. the second substrate layer, has a thickness of about 0.1–1 mm whereas the HTS layer is made of films having a thickness of about 200 nm each whereas the polished first substrate layer is polished to have a thickness of about 1–50 µm (although it initially may have had the same thickness as the other substrate layer). Particularly the high temperature superconducting films of the substrate structure are bonded to each other through annealing in oxygen under a high pressure and at a high temperature. The HTS films particularly comprise YBCO whereas the substrate layers comprise $SrTiO_3$, $LaAlO_3$, MgO or Y-$Zro_2$.

Therefore also a use of a multilayer structure as discussed above is disclosed for making superconducting microwave circuits through etching in the structure, in which the HTS layer forms a ground plane.

Therefore also a method of producing a substrate structure with a superconducting ground plane is disclosed. The method comprises the steps of providing a first and a second substrate layer covering each of said first and second substrate layers by a thin HTS film respectively; arranging one of the substrate layers so in relation to the other that the thin HTS films get in lose contact; bonding the HTS films together trough annealing in oxygen at a high temperature and under a high pressure to form a HTS layer; polishing one of the substrate layers on that side of it that is opposite to the HTS-layer to form a smooth insulating layer. Particularly the substrate layers initially have a thickness of about 0.1–1 mm. Particularly one of the substrate layers is polished to have a thickness of approximately 1–50 µm. Preferably a temperature of about 800–1300° C. is applied during the annealing processing step. In particular the method includes the steps of epitaxially growing a multilayer structure which consists of HTS films and insulating layers in an alternating manner on the smooth insulating layer.

A method of producing a multilayer structure comprising HTS films and insulating films is also provided which comprises the steps of providing a substrate structure as referred to above and epitaxially growing HTS films and insulating layers on the smooth insulating layer. Still further, the method advantageously includes the steps of etching out electronic circuits of the multilayer structure.

It is an advantage of the invention that the top insulating layer will be smooth enough for multilayers to grow epitaxially or top of it and that the structure can be made in a comparatively simply and cheap manner and thus that one of the main obstacles to the development of complex superconducting digital circuits and a microwave circuits is removed.

BRIEF DESCRIPTION OF THE DRAWINGS

The invention will in the following be more thoroughly described in an non-limiting manner and with reference to the accompanying drawings in which.

DETAILED DESCRIPTION

Figure 1:
FIG. 1 illustrates, in a simplified manner, a first and a second substrate layer with high temperature superconducting films thereon, FIG. 2 schematically illustrates bonding of the HTS films to each other.

FIG. 1 very schematically illustrates a first substrate layer 1A and a second substrate layer 1B cannot which is covered by a thin HTS film 2A and 2B respectively. Any appropriate method for covering the substrate layers by a HTS film can be used. Particularly the thin HTS films comprise YBCO films, but this merely constitutes an example. A number of other alternatives are of course also possible such as for example films of $BiSrCaCuO_2$, $TlBiSrCaCuO_2$, $HgBiSrCaCuO_2$ etc. The substrate layers advantageously comprise $SrTiO_3$ single crystals but they may also consists of Y—$ZrO_2$ (or YZS, Ytterium Stabilized Zirkoniun). They may also comprise MgO, sapphire. Also other alternatives are possible The materials should however be suitable for epitaxial growth of HTS thin film. The thickness of the substrate layers may advantageously comprise about 0.1–1 nm and the thin HTS films may have a thickness of about 200 nm. However, the thicknesses are not given for limitative purposes and also other values are possible, the values merely being given as a preferred implementation.

Figure 2:
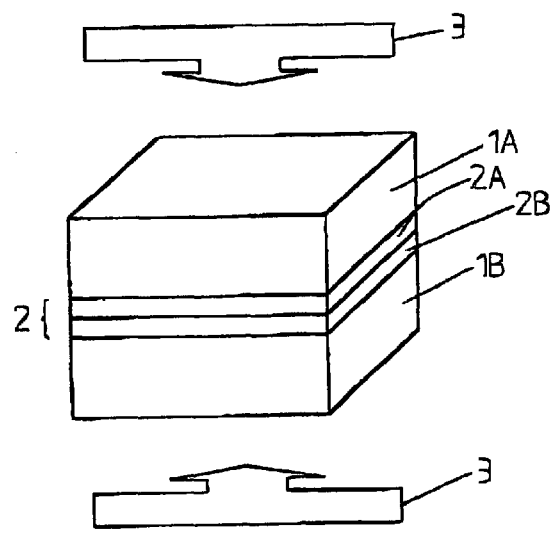
Figure 3:
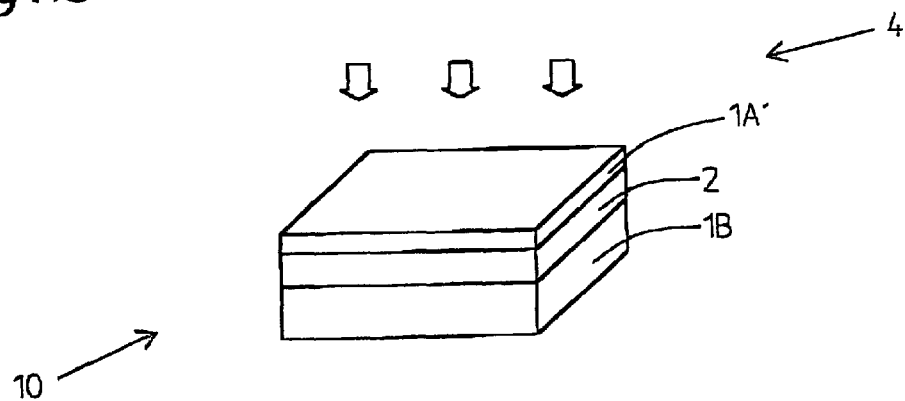
FIG. 3 illustrates polishing of the top substrate layer.

FIG. 2 illustrates how one of the substrate layers, substrate layer 1A, is placed upside-down and placed on top of the other substrate layer 1B in such a manner that the HTS films 2A, 2B get in close contact. The HTS films 2A, 2B are then bonded to each other through annealing in oxygen under application of a high pressure illustrated through pressurizing means 3 at an elevated temperature. The temperature may be within the range of 800–1300° C. A pressure of about several hundreds hg/$cm^2$ is advantageously used although this is also given as an example only FIG. 3 schematically illustrates the so formed structure in which the superconducting films 2A, 2B are bonded together to form a HTS layer 2 after the substrate layer 1A has been exposed to polishing by polishing means 4 to have a thickness of approximately about 1–50 µm (although it should be clear that these figures are not limitative) thus forming a smooth insulating layer 1A' on top of the HTS layer 2. A substrate structure with a buried HTS film is thus provided which buried HTS layer 2 forms a superconducting ground plane. Since it in this manner is possible to obtain a very smooth surface the substrate structure is convenient for epitaxial growth of multilayer structures consisting of HTS film and insulating films thereon Electronic circuits may with advantage be etcher out of the multilayer structure.

Figure 4:
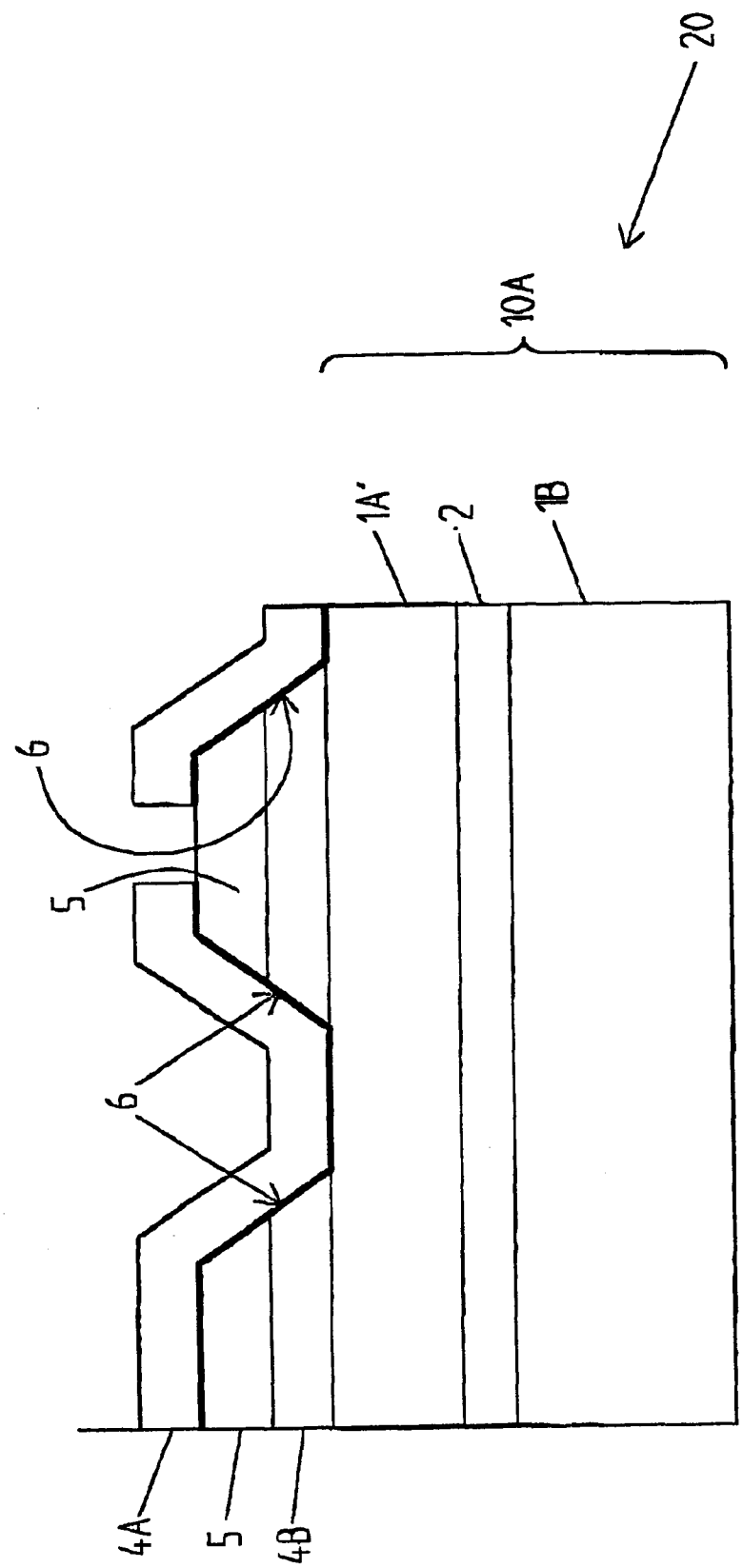
FIG. 4 illustrates a multilayer structure according to the invention.

FIG. 4 very schematically illustrates such a multilayer structure comprising a superconducting circuit with a buried ground plane 20 comprising a substrate structure 10A with a buried HTS layer 2 between a smooth insulating layer 1A' and a substrate layer 1B. On top of the substrate structure 10A superconducting electrodes 4A, 4B on either side of an isolator 5 such that Josephson functions 6 are formed.

Figure 5:
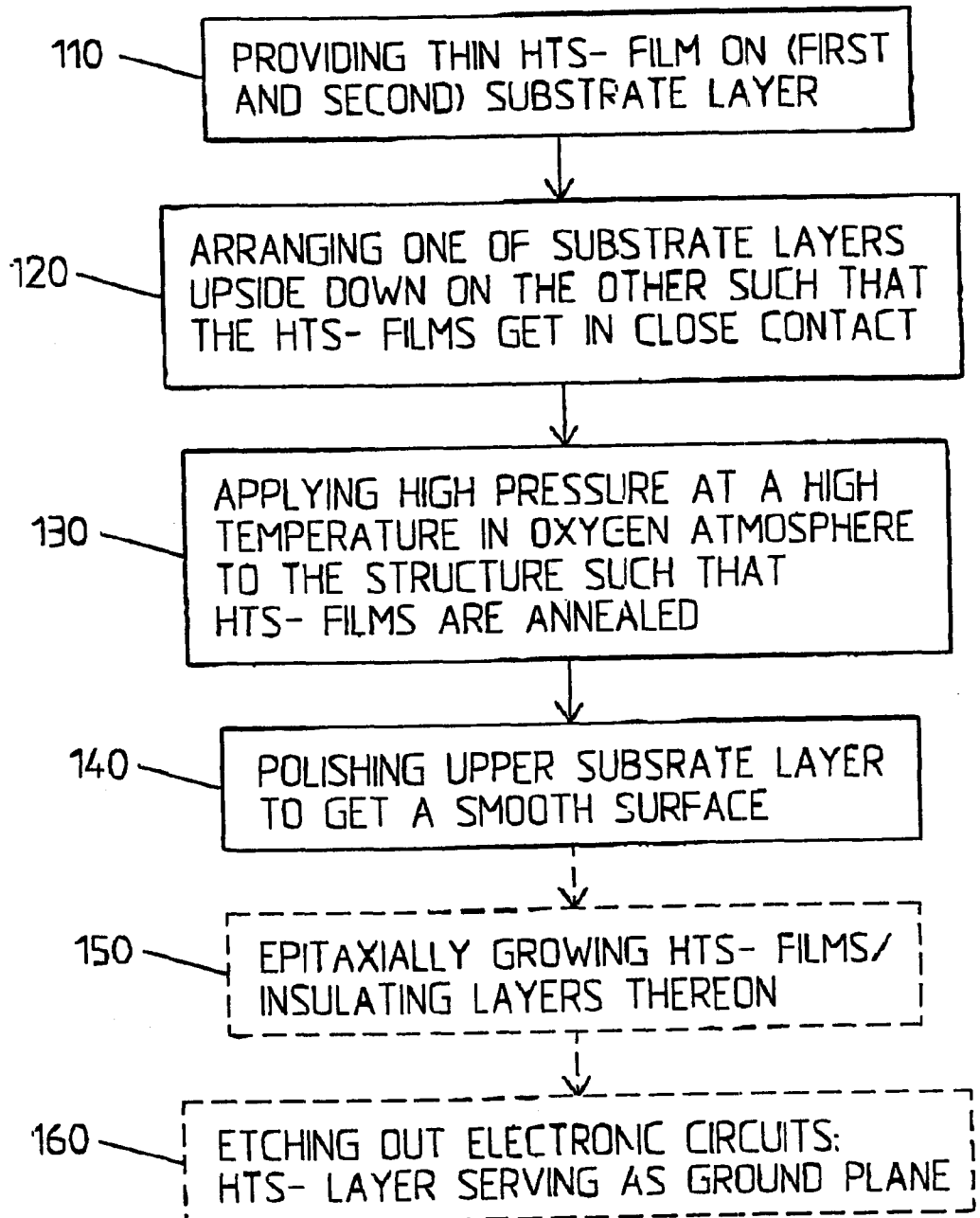
FIG. 5 is a flow diagram describing the process of making a substrate structure.

FIG. 5 shows the procedural steps of making a substrate structure and a multilayer respectively (illustrated in the form of a dimple flow diagram) starting with the step of providing thin HTS films on the first and the second substrate layers, 110. In a subsequent step one of the substrate layer is arranged upside down on the other such that the HTS films on either substrate layer get in close contact with each other, 120. Subsequently a high pressure is applied at a high temperature in an oxygen atmosphere to the so arranged structure such that the HTS films becomes annealed to each other to form a HTS layer, 130. Finally the upper substrate layer is polished to obtain a very smooth surface, 140.

For the forming of a multilayer structure HTS films and insulating layers are subsequently epitaxially grown on the smooth upper substrate layer, 150 whereafter electronic circuits are etched out of, the HTS layer serving as a ground plane for such circuits, The invention is not limited to the explicitly illustrated embodiments but it can be varied in a number of ways within the scope of the appended claims.

What is claimed is:

1. A superconducting (HTS) ground plane for epitaxial growth of multilayers thereon, wherein the substrate structure comprises a composite substrate structure having a first substrate layer and a second substrate layer, each substrate layer covered by a HTS film on at least one side, which HTS films are bonded together through annealing to form a buried superconducting layer, one of the substrate layers being polished to form a smooth insulating layer adjacent to an HTS layer.

2. The structure according to claim 1, wherein the first and second substrate layers respectively have a thickness of about 0.1–1 mm and in that the second substrate layer is polished to have a thickness of about 1–50 $\mu$m.

3. The structure according to claim 1, wherein the HTS films covering said first and second substrate layers are bonded together to form a HTS layer have a thickness of about 200 nm.

4. The structure according to claim 1, further comprising a large area substrate structure.

5. The structure according to claim 1, wherein a multilayer structure is epitaxially grown on top of the substrate layer forming a smooth insulator.

6. The structure according to claim 1, wherein HTS films are bonded to each other through annealing in oxygen under a high pressure and at a high temperature.

7. The structure according to claim 1, wherein the substrate layer forming a smooth insulator has a thickness of about 1–50 $\mu$m.

8. The structure according to claim 1, wherein the substrate layers comprise $SrTiO_3$ and in that the HTS films comprise YBCO.

9. A multilayer structure comprising a number of alternating high temperature superconducting (HTS) films and insulating layers epitaxially grown an a substrate structure comprising a superconducting ground plane, the substrate structure comprising a composite substrate structure having a first substrate layer and a second substrate layer, each substrate layer covered by a HTS film on at least one side thereof respectively, which HTS films are bonded together through annealing to form a buried HTS layer, the substrate layer on which the HTS films and insulating layers are grown being polished to form a smooth insulating layer.

10. The multilayer structure according to claim 9, wherein the second substrate layer has a thickness of about 0.1–1 mm and in that the HTS layer has a thickness of about 200 nm, whereas the polished first substrate layer is polished to have a thickness of about 1–50 $\mu$m.

11. The multilayer structure according to claim 9, wherein the HTS films are bonded to each other through annealing in oxygen under a high pressure and at a high temperature.

12. The multilayer structure according to claim 9, wherein the buried HTS layer comprises YBCO and in that the substrate layers comprise $SrTiO_3$.

13. The multilayer structure according to claim 9, wherein the multilayer structure is used for making superconducting microwave circuits by etching out the multilayer structure, the buried HTS film forming a ground plane.

14. A method of producing a substrate structure with a superconducting ground plane comprising the steps of:
   providing a first and a second substrate layer;
   covering each of said first and second substrate layers with a thin high temperature superconducting (HTS) film, respectively;
   arranging of the substrate layers such that the thin HTS films are in close contact to one another;
   bonding the HTS films together through annealing in oxygen at a high temperature and under a high pressure to form a buried HTS layer; and
   polishing one of the substrate layers on a side opposite to the buried HTS layer to form a smooth insulator.

15. The method according to claim 14, wherein the substrate layers have a thickness of about 0.1–1 mm before polishing.

16. The method according to claim 14, wherein one of the substrate layers is polished to have a thickness of about 1–50 $\mu$m.

17. The method according to claim 14, wherein a temperature of about 800–1300° C. is applied during the annealing step.

18. The method according to claim 14, further comprising the steps of epitaxially growing a multilayer structure comprising of HTS films and insulating layers in an alternating manner on the smooth insulator.

19. A method of producing a multilayer structure comprising high temperature superconducting (HTS) films and insulating films, comprising the steps of:
   providing a first and a second substrate layer;
   covering each of said first and second substrate layers with a thin HTS film respectively;
   arranging the substrate layers such that the thin HTS films are in close contact to one another,
   bonding the HTS films together through annealing in oxygen at a high temperature and under a high pressure to form a buried HTS layer;
   polishing one of the substrate layers on a side opposite to the buried HTS layer to form a smooth insulator; and
   epitaxially and alternatingly growing HTS films and insulating layers on the smooth insulator.

* * * * *